United States Patent
Yoon et al.

(10) Patent No.: US 8,693,247 B2
(45) Date of Patent: Apr. 8, 2014

(54) NON-VOLATILE MEMORY DEVICE AND METHOD FOR PROGRAMMING THE DEVICE, AND MEMORY SYSTEM

(71) Applicant: Samsung Electronics Co., Ltd., Suwon-si (KR)

(72) Inventors: Chi-Weon Yoon, Seoul (KR); Dong-Hyuk Chae, Seoul (KR); Sang-Wan Nam, Hwaseong-si (KR); Sung-Won Yun, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/919,127

(22) Filed: Jun. 17, 2013

(65) Prior Publication Data

US 2013/0279260 A1  Oct. 24, 2013

Related U.S. Application Data

(63) Continuation of application No. 13/157,344, filed on Jun. 10, 2011, now Pat. No. 8,472,247.

(30) Foreign Application Priority Data

Aug. 16, 2010  (KR) ........................ 10-2010-0078909

(51) Int. Cl.
*G11C 16/00* (2006.01)
*G11C 16/04* (2006.01)

(52) U.S. Cl.
USPC ............ 365/185.03; 365/185.17; 365/185.22; 365/185.23

(58) Field of Classification Search
None
See application file for complete search history.

(56) References Cited

U.S. PATENT DOCUMENTS

| | | | |
|---|---|---|---|
| 6,373,748 B2 | 4/2002 | Ikehashi et al. | |
| 6,798,697 B2 | 9/2004 | Hosono et al. | |
| 7,009,878 B2 | 3/2006 | Hosono et al. | |
| 7,457,158 B2 * | 11/2008 | Lee et al. | 365/185.03 |
| 7,542,344 B2 | 6/2009 | Kim | |
| 7,586,790 B2 | 9/2009 | Lee | |
| 7,590,027 B2 | 9/2009 | Makino | |
| 7,796,438 B2 | 9/2010 | Kim et al. | |
| 7,924,618 B2 * | 4/2011 | Lee | 365/185.18 |
| 8,385,119 B2 * | 2/2013 | Futatsuyama | 365/185.09 |
| 8,514,621 B2 * | 8/2013 | Choi et al. | 365/185.03 |

FOREIGN PATENT DOCUMENTS

| | | |
|---|---|---|
| KR | 1020080103786 A | 11/2008 |
| KR | 1020090019296 A | 2/2009 |

\* cited by examiner

*Primary Examiner* — Tan T. Nguyen
(74) *Attorney, Agent, or Firm* — Volentine & Whitt, PLLC

(57) ABSTRACT

A non-volatile memory device comprises a memory cell array comprising memory cells arranged in rows connected to corresponding word lines and columns connected to corresponding bit lines, a page buffer that stores a program data, a read-write circuit that programs and re-programs the program data into selected memory cells of the memory cell array and reads stored data from the programmed memory cells, and a control circuit that controls the page buffer and the read-write circuit to program the selected memory cells by loaded the program data from in page buffer and to re-program the selected memory cells by re-loaded the program data in the page buffer.

16 Claims, 10 Drawing Sheets

NON-VOLATILE MEMORY DEVICE AND METHOD FOR PROGRAMMING THE DEVICE, AND MEMORY SYSTEM

CROSS-REFERENCE TO RELATED APPLICATIONS

This is a Continuation application of U.S. patent application Ser. No. 13/157,344, filed Jun. 10, 2011 now U.S. Pat. No. 8,472,247, which claims priority under 35 U.S.C. §119 to Korean Patent Application No. 10-2010-0078909 filed on Aug. 16, 2010, the disclosure of which is hereby incorporated by reference in its entirety.

BACKGROUND OF THE INVENTION

Embodiments of the inventive concept relate generally to electronic memory technologies. More particularly, embodiments of the inventive concept relate to non-volatile memory devices and systems, and methods of programming non-volatile memory devices and systems.

Semiconductor memory devices can be roughly divided into two categories according to whether they retain stored data when disconnected from power. These categories include volatile memory devices, which lose stored data when disconnected from power, and non-volatile memory devices, which retain stored data when disconnected from power. Examples of volatile memory devices include dynamic read only memory (DRAM) and static read only memory (SRAM). Examples of non-volatile memory devices include masked read-only memory (MROM), programmable read-only memory (PROM), erasable programmable read-only memory (EPROM), and electrically erasable programmable read-only memory (EEPROM).

Flash memory, which is a form of EEPROM, is an increasingly popular type of non-volatile memory due to various attractive features, such as high integration density, shock resistance, and efficient power consumption. Accordingly, researchers are continually striving to refine and improve the characteristics of flash memory for broader adoption.

SUMMARY OF THE INVENTION

According one an embodiment of the inventive concept, a non-volatile memory device, comprises a memory cell array comprising memory cells arranged in rows connected to corresponding word lines and columns connected to corresponding bit lines, a page buffer that stores a program data, a read-write circuit that programs and re-programs the program data into selected memory cells of the memory cell array and reads stored data from the programmed memory cells, and a control circuit that controls the page buffer and the read-write circuit to program the selected memory cells by loaded the program data in the page buffer and to re-program the selected memory cells by re-loaded the program data in the page buffer to the read-write circuit.

According to another embodiment of the inventive concept, a non-volatile memory system comprises a non-volatile memory device comprising a memory cell array comprising memory cells arranged in rows connected to corresponding word lines and columns connected to corresponding bit lines, a page buffer that stores a program data, a read-write circuit that programs and re-programs the program data into the memory cells and reads stored data from programmed memory cells, a control circuit that controls the page buffer and the read-write circuit to program the memory cells by loaded the program data in the page buffer, and re-programs the memory cells by re-loaded the program data in the page buffer. The non-volatile memory system further comprises a memory controller that controls the non-volatile memory device, and a data buffer incorporated in the memory controller and configured to store the program data to be re-loaded to the page buffer.

According to still another embodiment of the inventive concept, a method of programming a non-volatile memory device comprises loading program data from a page buffer to a read-write circuit, programming the loaded program data into selected memory cells using a first incremental step pulse programming operation, re-loading the program data from the page buffer to the read-write circuit, and re-programming the re-loaded program data into the selected memory cells using a second incremental step pulse programming operation.

These and other embodiments of the inventive concept can improve device and system reliability and decrease the amount of time required to perform program operations.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

Figure 1:
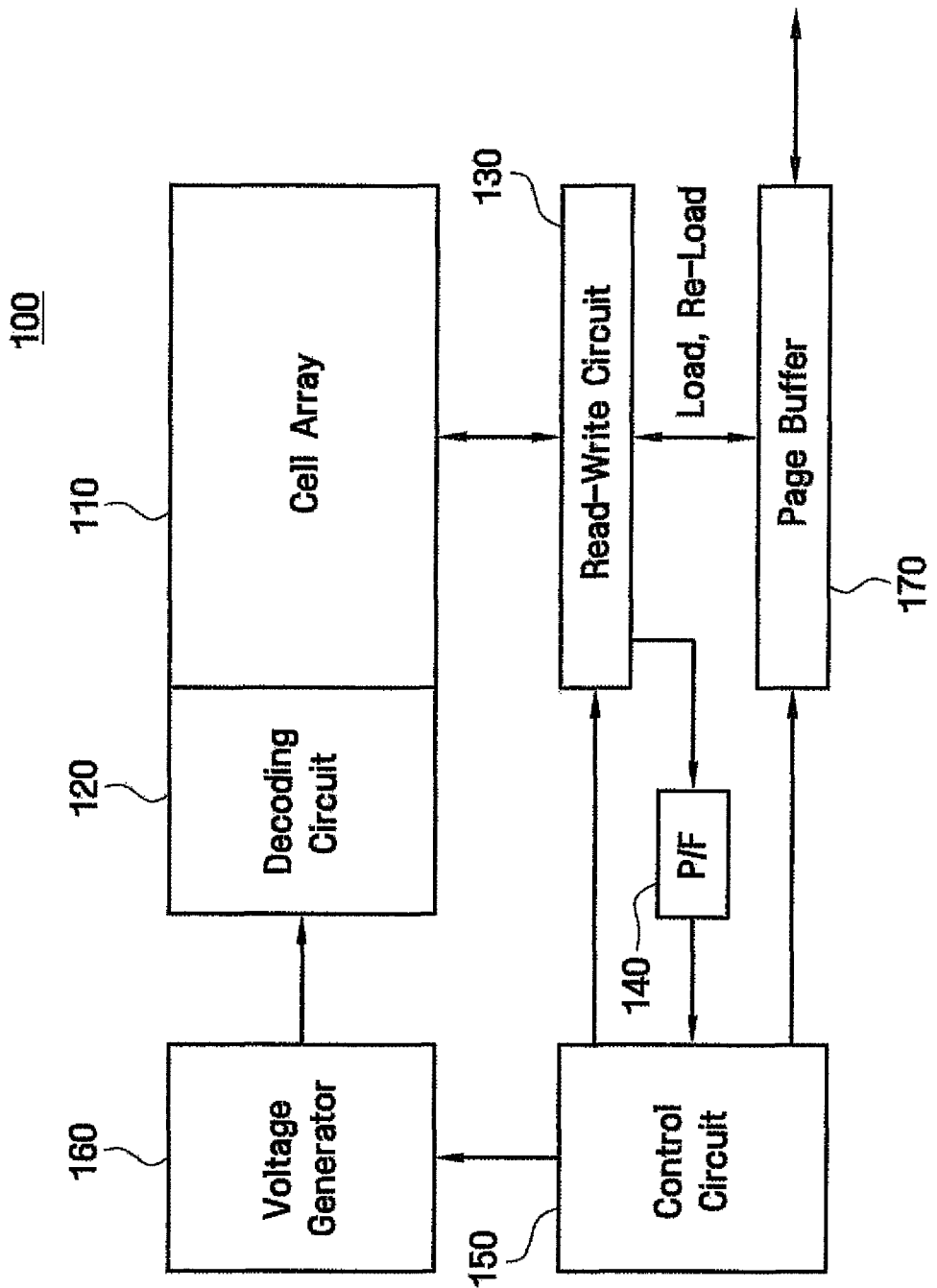
FIG. 1 is a block diagram illustrating a non-volatile memory device according to an embodiment of the inventive concept.
Figure 2:
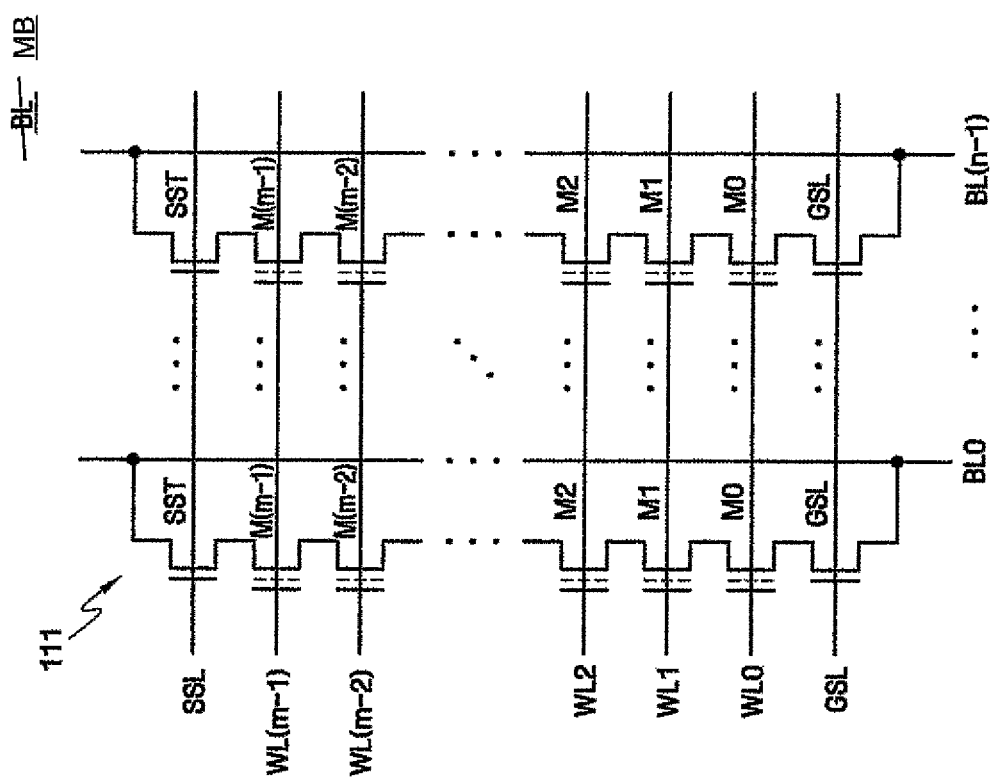
FIG. 2 is a circuit diagram illustrating a memory cell array shown in FIG. 1.
Figure 3:
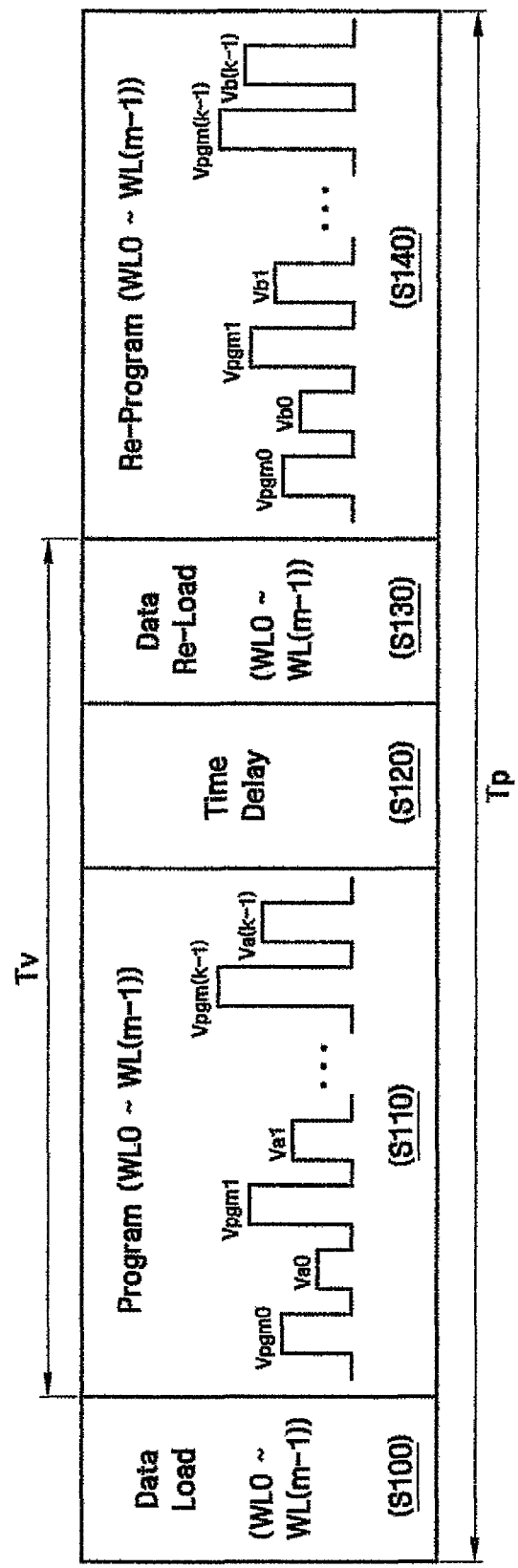
FIG. 3 is a conceptual diagram illustrating a method of programming a non-volatile memory device according to an embodiment of the inventive concept.
Figure 4:
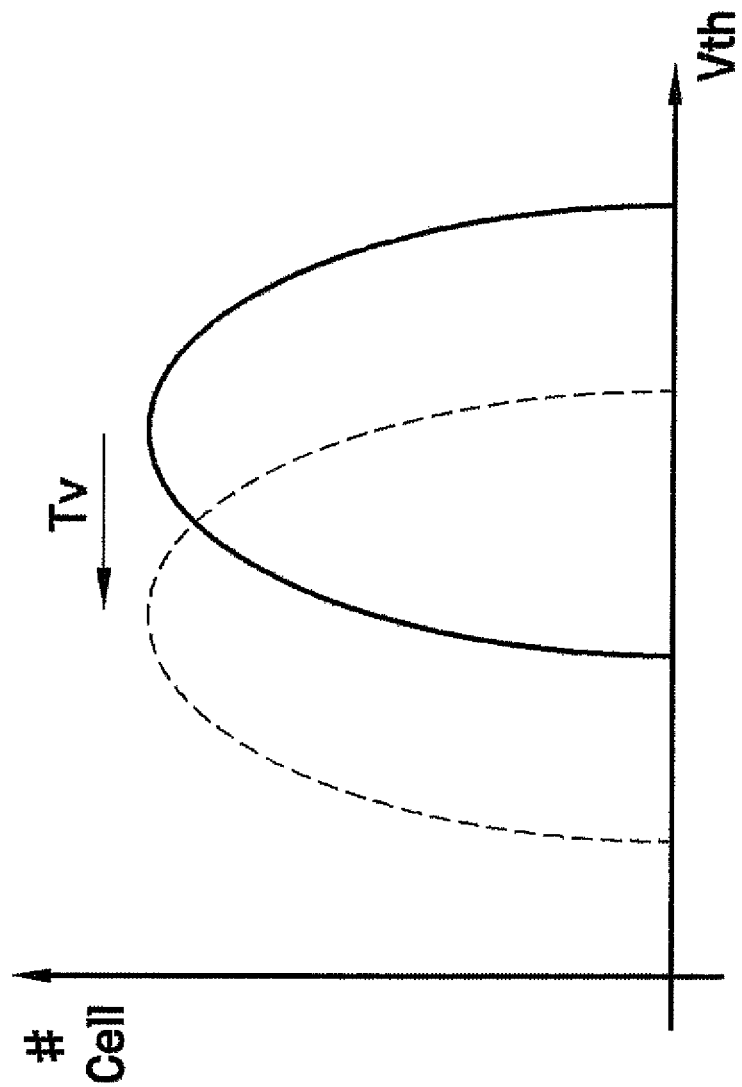
FIG. 4 is a threshold voltage diagram illustrating characteristics of programmed memory cells in a non-volatile memory device.
Figure 5:
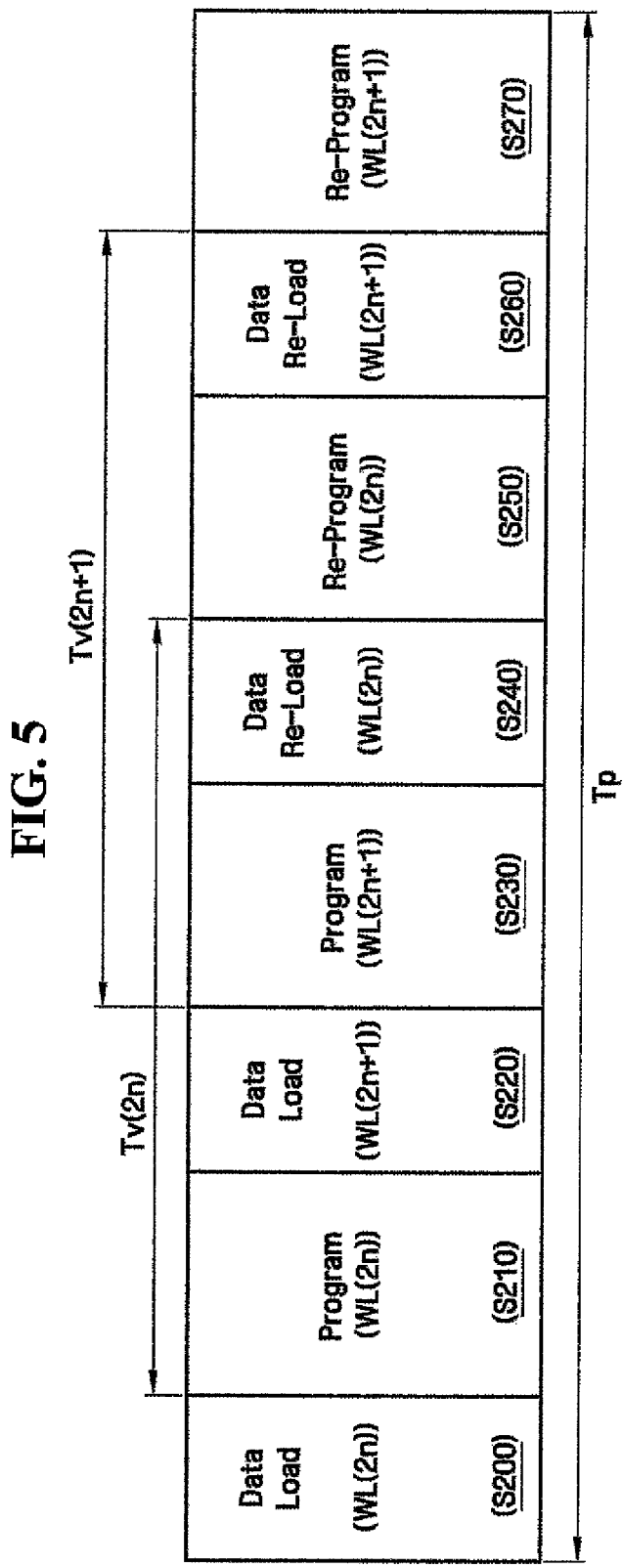
FIG. 5 is a conceptual diagram illustrating a method of programming a non-volatile memory device according to another embodiment of the inventive concept.

FIG. 1 is a block diagram illustrating a non-volatile memory device 100 according to an embodiment of the inventive concept, and FIGS. 2 through 5 illustrate various aspects of non-volatile memory device 100. In particular, FIG. 2 is a circuit diagram illustrating a memory cell array of non-volatile memory device 100, FIG. 3 is a diagram illustrating a method of programming non-volatile memory device 100 according to an embodiment of the inventive concept, FIG. 4 is a threshold voltage diagram illustrating characteristics of programmed memory cells in non-volatile memory device 100, and FIG. 5 is a diagram illustrating a method of programming non-volatile memory device 100 according to another embodiment of the inventive concept.

Referring to FIGS. 1 and 2, non-volatile memory device 100 comprises a memory cell array 110 configured to store R-bit data, where R is an integer greater than or equal to 1. In other words, each memory cell can be a single level memory cell (SLC) that stores one bit of data, or a multi-level memory cell (MLC) that stores multiple bits of data.

Memory cell array 110 is divided into a main region that stores general data and a spare region that stores information related to the general data, such as meta data. In some embodiments, the main region stores R-bit data, and the spare region stores 1-bit data.

Memory cell array 110 comprises memory cells arranged in rows connected to corresponding word lines, and columns connected to corresponding bit lines. In some embodiments, the memory cells are charge trap flash (CTF) memory cells that use a dielectric layer of $Si_3N_4$, $Al_2O_3$, HfAlO, or HfSiO as a charge storage layer. Examples of CTF memory cells using a dielectric layer as a charge storage layer are presented in U.S. Pat. No. 6,858,906 issued Feb. 22, 2005, U.S. Patent Publication No. 2004-0169238 published Sep. 2, 2004, and U.S. Patent Publication No. 2006-0180851 published Aug. 17, 2006, the respective disclosures of which are hereby incorporated by reference in their entirety.

The memory cells in memory cell array 110 are arranged in multiple memory blocks. The memory cells in each memory block can have a NAND string structure as illustrated in FIG. 2. For explanation purposes, it will be assumed that memory cell array 110 comprises charge trap flash memory cells having the NAND string structure; however, embodiments of the inventive concept are not limited to the described types of memory cells and memory cell configurations.

The NAND string structure of FIG. 2 is formed on a semiconductor substrate in a vertical direction with respect to the semiconductor substrate. Thus, non-volatile memory device 100 can be a vertical NAND flash memory device. However, it is not limited thereto, and it can take other forms.

A memory block MB comprises multiple strings 111 that correspond to multiple columns or bit lines BL0-BL(n−1). Each string 111 comprises a string selection transistor SST, multiple memory cells M0-Mm−1, and a ground selection transistor GST. In each string 111, a drain of string selection transistor SST is connected to the corresponding bit line, and a source of ground selection transistor GST is connected to a common source line CSL. Also, memory cells M0-Mm−1 are connected in series between the source of string selection transistor SST and the drain of ground selection transistor GST. The control gates of the memory cells in the same column are commonly connected to corresponding word lines WL0-WL(n−1). String selection transistor SST is controlled by a voltage applied through a string selection line SSL, and ground selection transistor GST is controlled by a voltage applied through a ground selection line GSL. Also, memory cells M0-M(m−1) are controlled by a voltage applied through corresponding word lines WL0-WL(m−1). The memory cells connected to each of word lines WL0-WL(m−1) store one or more pages of data.

Referring again to FIG. 1, a control circuit 150 controls program and read operations of non-volatile memory device 100. Control circuit 150 loads program data to page buffer 170 and programs memory cells by a read-write circuit 130. Control circuit 150 can also control page buffer 170 and read-write circuit 130 so that memory cells can be re-programmed by re-loading the program data to page buffer 170 and re-programming the program data using read-write circuit 130. In some embodiments, the programming and re-programming are performed through incremental step pulse programming (ISPP) in which multiple program loops are repeated. Each program loop comprises a program step in which a program voltage is applied to a word line of selected memory cells to modify their threshold voltages, and a verification step in which a verification voltage is applied to the word lines of the selected memory cells to determine whether they have been successfully programmed. Examples of ISPP will be described in further detail below.

A voltage generator 160 generates voltages to be supplied to different word lines depending on an operation mode of non-volatile memory device 100. These voltages can include, for instance, a program voltage Vpgm, a read voltage Vread, and a pass voltage Vpass. Voltage generator 160 also generates a voltage to be supplied to a bulk on which the memory cells are formed, such as a well region. The generation of these voltages can be controlled by control circuit 150.

A decoding circuit 120 operates under the control of control circuit 150 to select a memory block or sectors of memory cell array 110, and to select only one of the word lines of the selected memory block or sector. Decoding circuit 120 also operates under the control of control circuit 150 to provide the selected word line and non-selected word lines with word line voltages generated by voltage generator 160. The voltage level and timing of voltages supplied to the word lines can be controlled by control circuit 150.

Read-write circuit 130 is also controlled by control circuit 150. Depending on an operating mode of non-volatile memory device 100, read-write circuit 130 can operate as a sense amplifier or a write driver. For example, in a verify or read operation, read-write circuit 130 can be operated as a sense amplifier to read data stored in memory cell array 110. In a program operation, read-write circuit 130 can be operated as a write driver to drive bit lines according to program data to be stored in memory cell array 110. More specifically, in a program operation, after program data to be programmed in memory cell array 110 is loaded in page buffer 170, read-write circuit 130 programs the selected memory cells by driving the bit lines based on the loaded program data. Where program data to be re-programmed is re-loaded in page buffer 170, read-write circuit 130 can re-program the selected memory cells by driving the bit lines based on the re-loaded program data.

Page buffer 170 stores program data provided from an external source, such as a memory controller or host, and read data output from memory cell array 110. In certain non-volatile memory devices, program data stored in a page buffer is deleted after being programmed in a memory cell array through a read-write circuit. However, page buffer 170 receives program data from memory cells through a read operation of read-write circuit 130 after the memory cells are programmed. Consequently, program data for re-programming the memory cells can be stored even after memory cell programming.

A pass/fail verification circuit 140 operates under the control of control circuit 150 to perform a program verification on memory cells during a verification period of each program loop. Pass/fail circuit 140 outputs a verification result to control circuit 150, and control circuit 150 determines whether to perform subsequent program loops according to the verification result. For example, where it is determined that the selected memory cells are successfully programmed, programming of the selected memory cells can be finished without performing additional program loops. Where it is determined that the memory cells are not successfully programmed, further program loops can be executed until a predetermined number of iterations is completed or until all memory cells are programmed.

Referring to FIGS. 1, 3, and 4, a program operation of non-volatile memory device 100 is performed as follows.

First, program data is loaded to page buffer 170 (S100). Specifically, control circuit 150 loads program data provided from an external source to page buffer 170.

Next, the loaded program data is programmed into selected memory cells (S110). Specifically, control circuit 150 programs the selected memory cells by controlling decoding circuit 120, voltage generator 160, page buffer 170, and read-write circuit 130 to apply program voltages Vpgm0-Vpgm(k−1) and verification voltages Va0-Va(k−1) alternately to a selected word line, to apply a pass voltage Vpass to non-selected word lines, and to apply a voltage of 0 V to a bulk including the selected memory cells. Here, program voltages Vpgm0-Vpgm(k−1) can be applied according to the ISPP method where a level of program voltages Vpgm0-Vpgm(k−1) increases in a stepwise fashion in successive program loops. The voltage levels and number of applications of program voltages Vpgm0-Vpgm(k−1) in each program loop can be changed or modified in various ways according to external controls, such as a memory controller, or internal controls, such as control circuit 150.

Program voltages Vpgm0-Vpgm(k−1) and verification voltages Va0-Va(k−1) are applied alternately without a time delay. Where pass/fail verification circuit 140 determines that the selected memory cells are successfully programmed, programming of the selected memory cells is completed without performing further program loops.

After step S110, the program operation is delayed for a predetermined period of time (S120). During this delay, electrons and/or holes in a charge storage layer of the programmed memory cells can be re-distributed. Such re-distribution, as illustrated in FIG. 4, changes a threshold voltage of the programmed memory cells, and it can negatively affect product reliability. Although FIG. 4 illustrates a threshold voltage distribution of a single level memory cell, the re-distribution phenomenon also applies to multi level memory cells.

To avoid programming errors, it may be necessary to address the effects of the re-distribution. To effectively address the effects of the re-distribution, the step S120 should be sufficient to allow the re-distribution to occur. In general, re-distribution can occur after program voltage Vpgm0 is applied, i.e., between the application of program voltage Vpgm0 and the end of step S110. Accordingly, step 120 can be omitted where the time for programming the selected memory cells is sufficiently long to allow for redistribution.

Next, the program data is re-loaded to page buffer 170 (S130). Specifically, control circuit 150 re-loads program data read from memory cells to page buffer 170.

Next, using the re-loaded program data, the selected memory cells are re-programmed (S140). Re-programming of the selected memory cells is similar to the programming of step S110, so a description of similar steps will be omitted to avoid redundancy. In the example of FIG. 3 the respective levels of program voltages Vpgm0-Vpgm(k−1) for programming are the same as the respective levels of program voltages Vpgm0-Vpgm(k−1) for re-programming. However, the respective levels of verification voltages Va0-Va(k−1) for programming and the respective levels of verification voltages Vb0-Vb(k−1) for re-programming are different. For example, for smaller variance control, verification voltages Vb0-Vb(k−1) for re-programming can be greater than verification voltages Va0-Va(k−1) for programming. Although FIG. 3 only illustrates that the levels of verification voltages Vb0-Vb(k−1) for re-programming are greater than the levels of verification voltages Va0-Va(k−1) for programming, in some situations the levels of verification voltages Vb0-Vb(k−1) for re-programming can be smaller than the levels of verification voltages Va0-Va(k−1) for programming.

After programming the selected memory cells without a separate time delay for re-distribution between program voltages Vpgm0-Vpgm(k−1) and verification voltages Va0-Va(k−1), the selected memory cells can be re-programmed after waiting for a time delay to create enough re-distribution. In this case, overall program time Tp can be reduced. In other words, where a separate delay time for re-distribution of the selected memory cells programmed between program voltage Vpgm0-Vpgm(k−1) and verification voltages Va0-Va(k−1) is continuously inserted, a summation of such time delays are typically very large and it can be a problem for reducing program operation time. However, in the embodiment of FIG. 3, because the selected memory cells are re-programmed after programming the selected memory cells without having a separate time delay between program voltages Vpgm0-Vpgm(k−1) and verification voltages Va0-Va(k−1) followed by waiting for a time delay to create enough re-distribution, the overall programming time Tp can be reduced compared to where a separate time delay is inserted between program voltages Vpgm0-Vpgm(k−1) and verification voltages Va0-Va(k−1).

Also, for certain programmed memory cells, it can be possible to have insufficient re-distribution during the time delay inserted between program voltages Vpgm0-Vpgm(k−1) and verification voltages Va0-Va(k−1). Because the method of FIG. 3 allows the selected memory cells to have sufficient re-distribution time Tv and they are re-programmed after having enough re-distribution, it can improve the reliability of non-volatile memory device 100.

Next, referring to FIG. 5, a modified method of programming non-volatile memory device 100 is described.

Referring to FIGS. 1 and 5, first program data is loaded to page buffer 170 (S200). Specifically, control circuit 150 loads program data provided from an external source and to be programmed into selected memory cells included in a first group to page buffer 170. The first group, for example, can be memory cells connected to even-numbered word lines WL(2n).

Next, the loaded first program data is programmed into selected memory cells in the first group (S210). This programming operation is performed similar to step S110 of FIG. 3, so additional description thereof will be omitted to avoid redundancy.

Next, second program data is loaded to page buffer 170 (S220). Specifically, control circuit 150 loads program data provided from an external source and to be programmed into selected memory cells included in a second group to page buffer 170. The second group, for example, can be selected memory cells connected to odd-numbered word lines WL(2n+1).

Next, the loaded second program data is programmed into the selected memory cells that belong to the second group (S230). This programming operation is performed similar to step S110 of FIG. 3, so additional description thereof will be omitted to avoid redundancy.

Next, the first program data is re-loaded (S240), and the selected memory cells that belong to the first group are re-programmed (S250). Specifically, control circuit 150 controls page buffer 170 and read-write circuit 130 to re-load the first program data to be re-programmed into memory cells that belong to the first group. And, the re-loaded program data is re-programmed into the memory cells that belong to the first group.

Next, the second program data are re-loaded, and the selected memory cells that belong to the second group are re-programmed (S260) and (S270). Specifically, control circuit 150 controls page buffer 170 and read-write circuit 130 to re-load the second program data to be re-programmed into the selected memory cells that belong to the second group.

Thus, in the method of FIG. 5, the selected memory cells are divided into the first and second groups, and those groups are programmed and re-programmed sequentially. Unlike other embodiments where all of the selected memory cells are programmed and re-programmed after waiting for a predetermined time delay without group classification, the memory cells are divided into first and second group and continuously programmed and re-programmed. This can eliminate the need to wait for a predetermined time delay. Where it is not necessary to wait for a predetermined time delay, the performance of non-volatile memory device 100 can be improved.

In the embodiment of FIG. 5, although the first and second groups are defined as selected memory cells connected to even-numbered word lines WL(2n) and odd-numbered word lines WL(2n+1) respectively, the first and second groups can be defined in other ways. Also, in FIG. 5 selected memory cells connected to the even-numbered word lines WL(2n) are programmed first and selected memory cells connected to odd-numbered word lines WL(2n+1) are programmed later. However, the programming order can change if needed. Also, in the embodiment of FIG. 5 loading and re-loading of program data into selected memory cells that belong to the first and second groups is divided into separate steps. However, in other embodiments, program data associated with selected memory cells connected all word lines can be loaded/re-loaded to page buffer 170 and then be programmed at different times.

Where the programming of non-volatile memory device 100 is performed according to the method of FIG. 5, selected memory cells that belong to the first and second groups can have sufficient re-distribution times Tv(2n) and Tv(2n+1) and the overall programming time Tp can be reduced.

Figure 6:
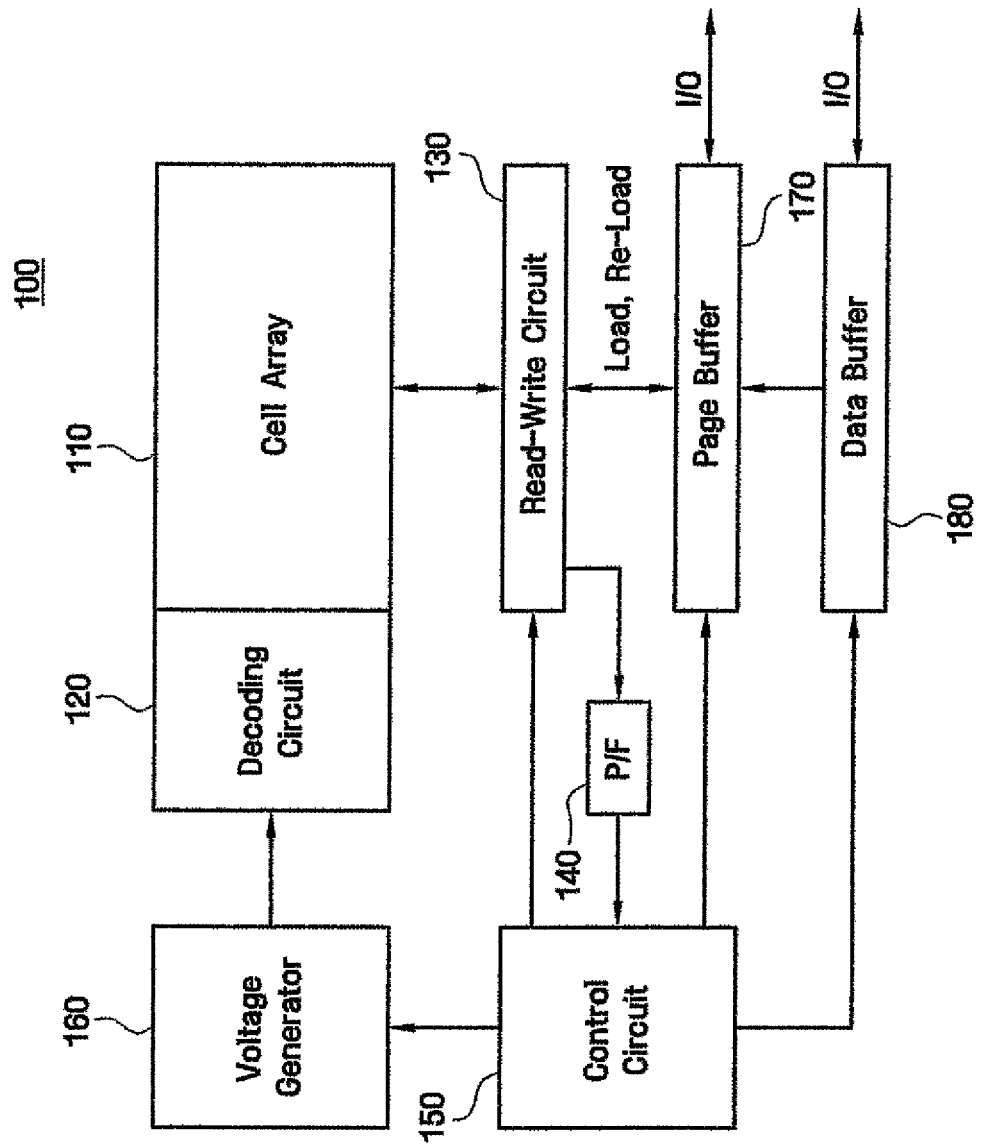
FIG. 6 is a block diagram illustrating a non-volatile memory device according to another embodiment of the inventive concept.

FIG. 6 is a block diagram illustrating non-volatile memory device 100 according to a modified embodiment of the inventive concept. This embodiment is similar to the embodiment of FIG. 1, so further description of similar features will be omitted to avoid redundancy.

Compared to non-volatile memory device 100 of FIG. 1, non-volatile memory device 100 of FIG. 6 further comprises a data buffer 180. Data buffer 180 stores program data provided from an external source, such as a memory controller or a host. Program data stored in data buffer 180 is provided to page buffer 170 after programming selected memory cells and is used for data re-loading for re-programming. Consequently, the program data re-loaded to page buffer 170 is not program data read from programmed memory cells, but data provided from data buffer 180.

Figure 7:
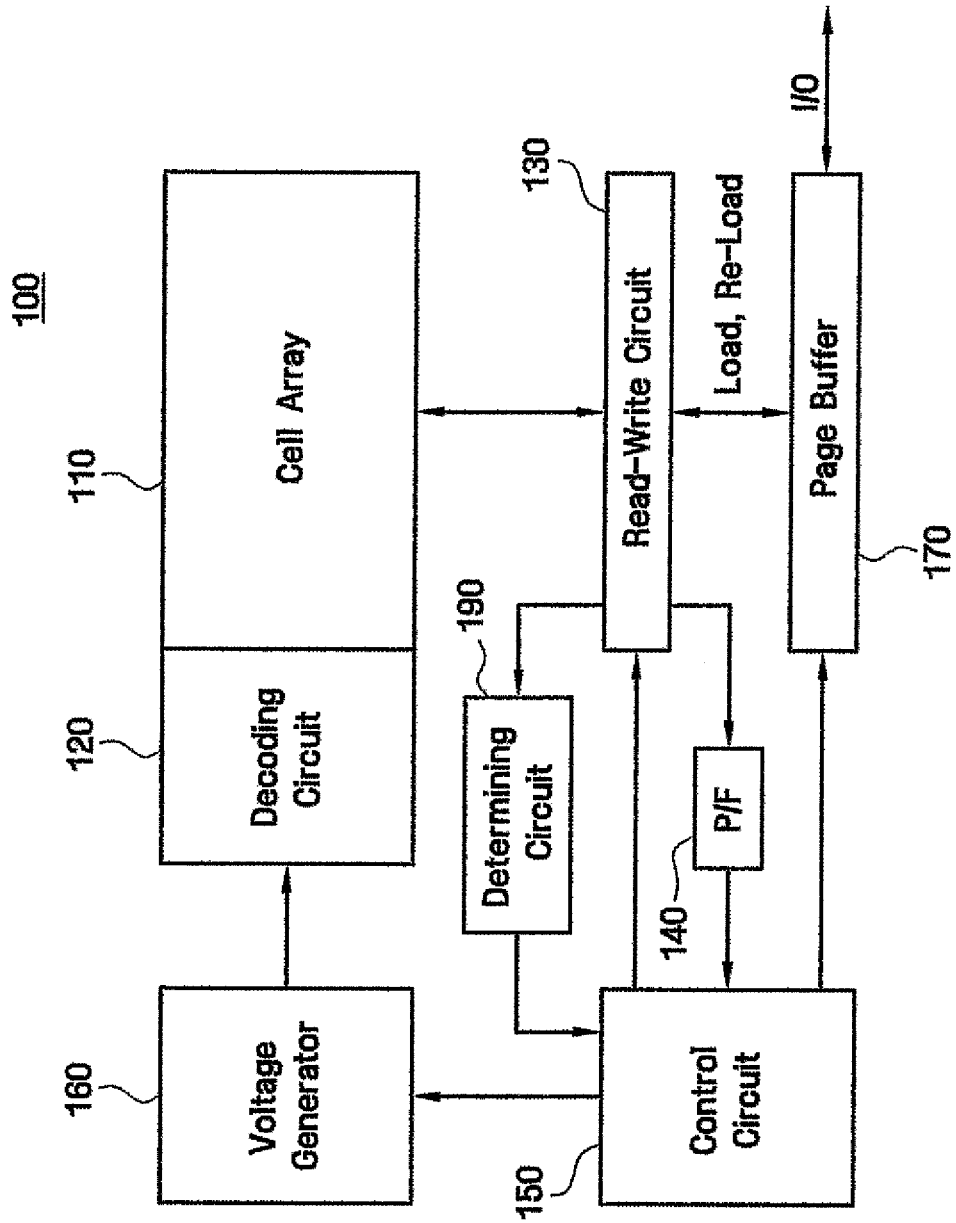
FIG. 7 is a block diagram illustrating a non-volatile memory device according to another embodiment of the inventive concept.
Figure 8:
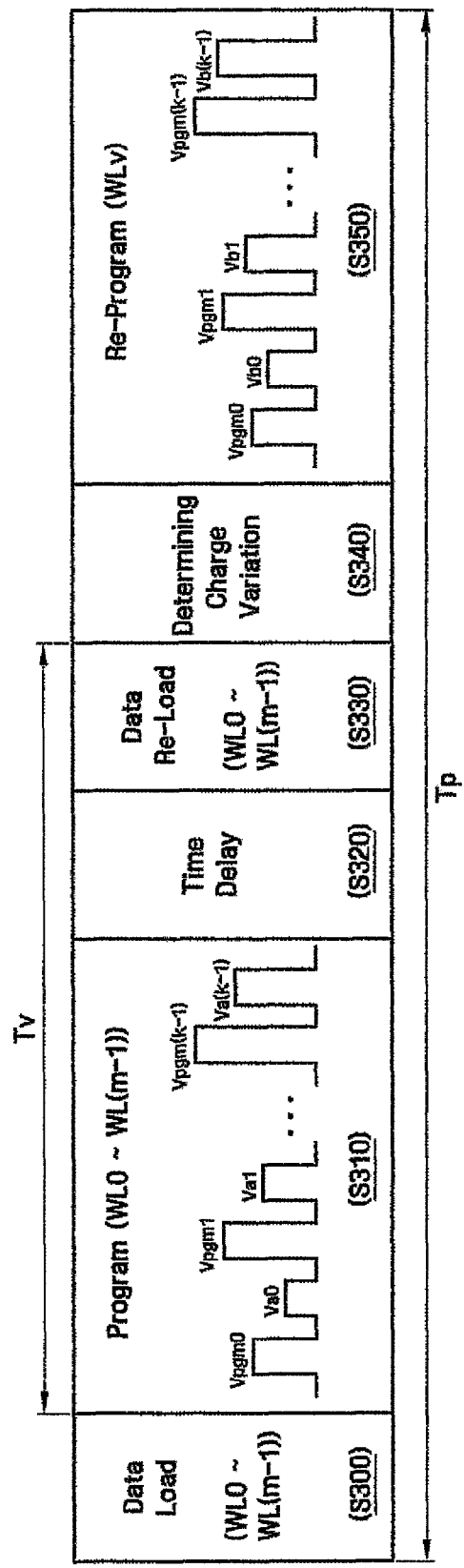
FIG. 8 is a diagram illustrating a method of programming a non-volatile memory device according to another embodiment of the inventive concept.

FIG. 7 is a block diagram illustrating non-volatile memory device 100 according to another modified embodiment of the inventive concept. FIG. 8 is a conceptual diagram illustrating a method of programming non-volatile memory device 100 of FIG. 7. The embodiment of FIG. 7 is similar to the embodiment of FIG. 1, so a further description of similar features will be omitted to avoid redundant description.

Compared to non-volatile memory device 100 of FIG. 1, non-volatile memory device 100 of FIG. 7 further comprises a determining circuit 190. Determining circuit 190 determines a change in charge characteristics of selected memory cells. Specifically, determining circuit 190 determines how much the charge characteristics of the selected memory cells have changed during a time delay after memory cell programming. A result of determining circuit 190 can be delivered to a control circuit 150, and control circuit 150 can re-program the selected memory cells according to the result of determining circuit 190. Although FIG. 7 does not show data buffer 180, this feature can also be included in the embodiment of FIG. 7.

Referring to FIGS. 7 and 8, program data is loaded into read-write circuit 130, and the loaded program data is programmed into selected memory cells (S300) and (S310). Next, after a predetermined time delay, the program data is re-loaded (S320) and (S330). The operations for programming and re-loading program data are similar to those described above in relation to FIG. 3, so a further description of these operations will be omitted.

Next, the change in charge characteristics of the programmed memory cells is determined (S340). Specifically, determining circuit 190 determines the charge characteristics change during a re-distribution time Tv of the programmed memory cells and delivers the result to control circuit 150.

Next, only memory cells having changed charge characteristics are re-programmed (S350). Specifically, control circuit 150 controls page buffer 170 and write circuit 130 to re-program memory cells connected to a word line WLv with program data re-loaded from page buffer 170, where the memory cells connected to word line WLv are determined to have charged charge characteristics.

As described above, where selected memory cells are programmed and re-programmed, unnecessary re-programming can be reduced and programming time Tp can be further reduced.

Figure 9:
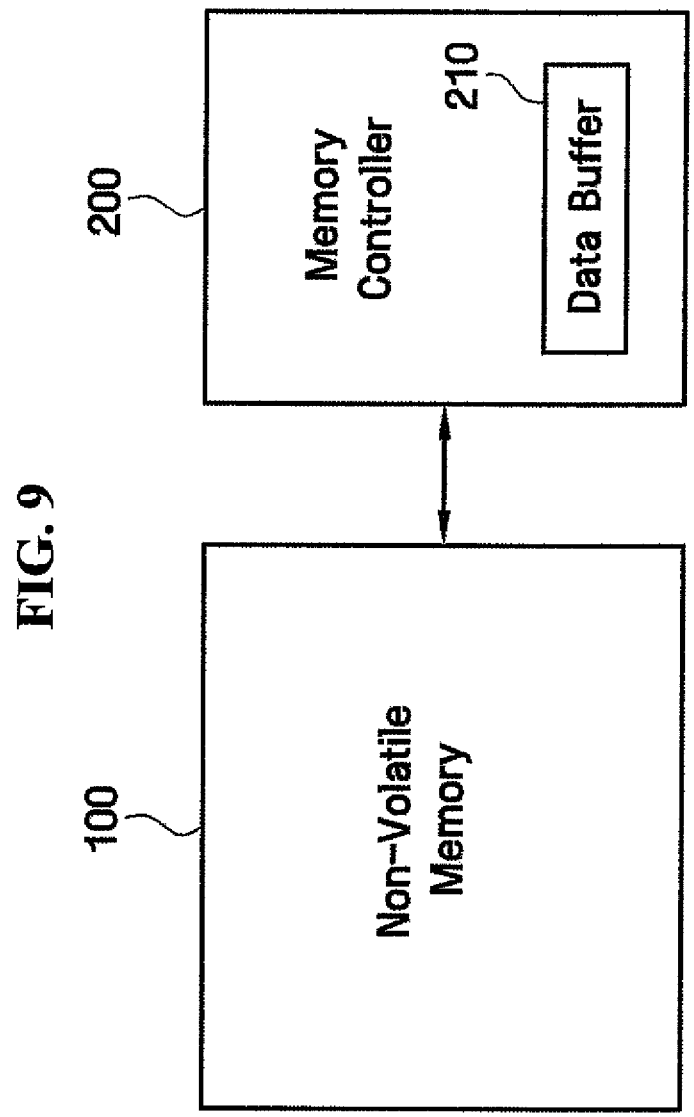
FIGS. 9 and 10 are block diagrams illustrating non-volatile memory systems according to embodiments of the inventive concept.
Figure 10:
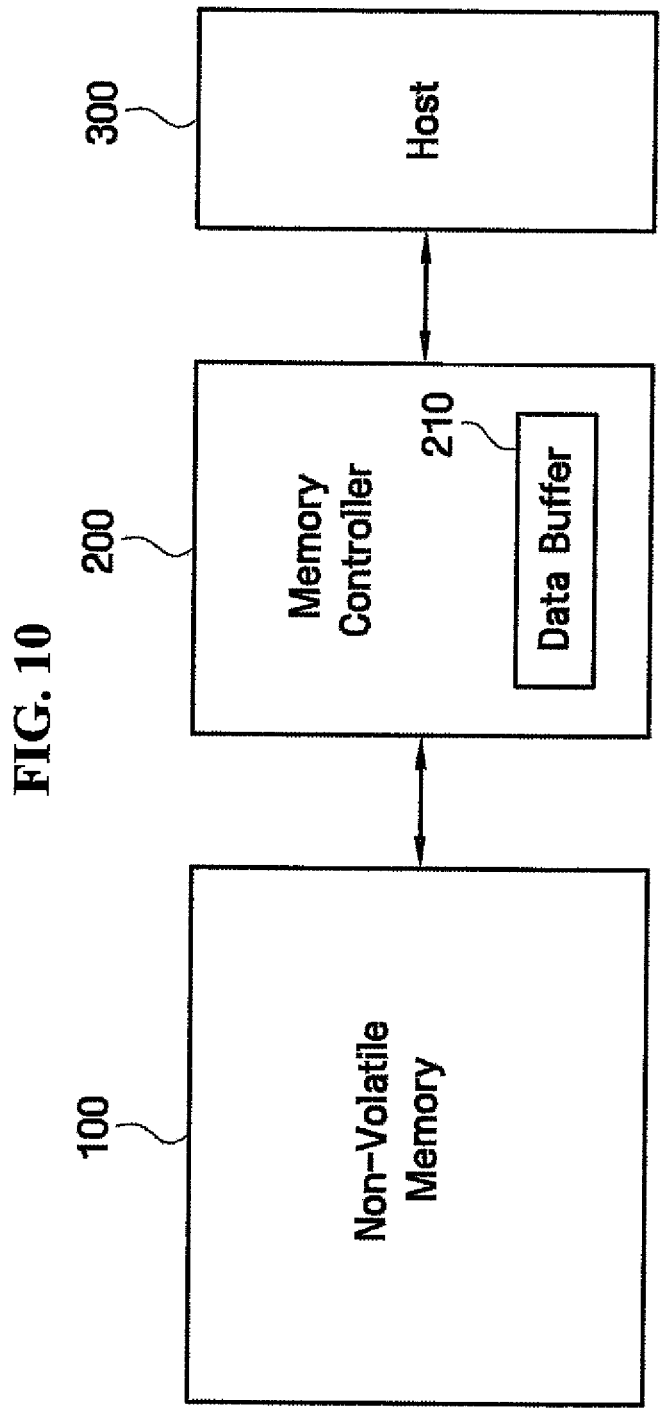

FIGS. 9 and 10 are block diagrams illustrating non-volatile memory systems according to embodiments of the inventive concept.

Referring to FIG. 9, a non-volatile memory system comprises non-volatile memory device 100 and a memory controller 200 that controls non-volatile memory device 100. Memory controller 200 comprises a data buffer 210 that receives program data from an external source and stores the program data. Non-volatile memory device 100 can be implemented as in the embodiments described above.

After memory cells of non-volatile memory device 100 are programmed, memory controller 200 controls data buffer 210 to provide page buffer 170 of non-volatile memory device 100 with program data stored in data buffer 210. Accordingly, the program data to be re-programmed into the memory cells is provided to page buffer 170 of non-volatile memory device 100 from data buffer 210 installed outside non-volatile memory device 100.

Memory controller 200 provides non-volatile memory device 100 with input signals, such as command signals and address signals, to control read and write operations.

In certain embodiments, the system of FIG. 9 is incorporated in a memory card. The memory card can be designed to satisfy industry standard for electronic devices such as cellular phones, two-way communication systems, one way pagers, two-way pagers, personal communication systems, portable computers personal digital assistants (PDAs), audio and/or video players, digital and/or video cameras, navigation systems, and global positioning systems (GPSs), and others. The system of FIG. 9 can also be embedded in other forms, such as a memory stick.

Referring to FIG. 10, a non-volatile memory system comprises non-volatile memory device 100, memory controller 200, and a host system 300. Host system 300 is connected to memory controller 200 through a bus and provides memory controller 200 with control signals to allow memory controller 200 to control operations of non-volatile memory device 100. Host system 300 can be a processing system used in cellular phones, two-way communication systems, one way pagers, two-way pagers, personal communication systems, portable computers, PDAs, audio and/or video players, digital and/or video cameras, navigation systems, GPSs, and other devices.

Although not shown, a system according to another embodiment of the inventive concept can be a computer system comprising a central processing unit (CPU) and non-volatile memory device 100. In the computer system, non-volatile memory device 100 can be connected to the CPU directly or through a computer bus architecture, and it can store an operating system (OS) instruction set, a basic input/output start up (BIOS) instruction set, or an advanced configuration and power interface (ACPI) instruction set. Also, non-volatile memory device 100 can be used in a mass storage device such as a solid state disk (SSD).

As indicated by the foregoing, in a non-volatile memory device, system, and related methods of programming programmed memory cells are provided with sufficient re-distribution time prior to re-programming, so device reliability can be improved. In addition, during programming, selected memory cells are not provided with a separate re-distribution time, so overall programming time can be reduced.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a non-volatile memory device including a plurality of memory cells including a first group of memory cells connected to a first word line and a second group of memory cells connected to a second word line, comprising:
    loading first program data from an external source;
    programming the first group of the memory cells with the first program data loaded from the external source;
    verifying the first group of the memory cells with applying a first verify voltage to the first word line;
    loading second program data from the external source;
    programming the second group of the memory cells with the second program data loaded from the external source;
    verifying the second group of the memory cells with applying a second verify voltage to the second word line;
    re-loading the first program data from the external source;
    re-programming the first group of the memory cells with the re-loaded first program data; and
    verifying the first group of the memory cells after the re-programming with applying a third verify voltage different from the first verify voltage to the first word line,
    wherein the second word line is upper adjacent to the first word line, and substantially no additional time delay exists between the programming the first group of memory cells and the re-programming the first group of memory cells,
    wherein each of the memory cells of the non-volatile memory device includes a charge storage layer,
    wherein during the programming the second group of memory cells, a threshold voltage of at least one of the first group of memory cells is decreased.

2. The method of claim 1, wherein each of the memory cells of the non-volatile memory device is charge trap flash (CTF) memory cell.

3. The method of claim 1, wherein the first group of memory cells include a memory cell connected to even-numbered word line WL(2n), and the second group of memory cells include a memory cell connected to odd-numbered word line WL(2n+1).

4. The method of claim 1, further comprising:
    re-loading the second program data from the external source; and
    re-programming the second group of memory cells with the re-loaded second program data; and
    verifying the second group of the memory cells after the re-programming with applying a fourth verify voltage different from the second verify voltage to the second word line,
    wherein substantially no additional time delay exists between the programming the second group of memory cells and the re-programming the second group of memory cells.

5. The method of claim 1, wherein during the programming the second group of memory cells, electrons and/or holes in the charge storage layer of at least one of the first group of memory cells are re-distributed.

6. The method of claim 1, wherein the first verify voltage is equal to the second verify voltage.

7. The method of claim 1, wherein the programming and re-programming comprise step pulse programming.

8. The method of claim 7, wherein the programming comprises a first incremental step pulse programming and re-programming comprises a second incremental step pulse programming.

9. The method of claim 1, further comprising determining a change in charge characteristics of the first group of memory cells,
    wherein the re-programming the first group of memory cells comprises re-programming only memory cell of the first group of memory cells having the changed charge characteristics.

10. A non-volatile memory device, comprising:
    a semiconductor substrate;
    a NAND string structure including a plurality of memory cells including a first group of memory cells connected to a first word line and a second group of memory cells connected to a second word line, formed above the semiconductor substrate in a vertical direction with respect to the semiconductor substrate;
    a page buffer configured to store a first and second program data from a external source;
    a read-write circuit configured to program and re-program the first program data into the first group of memory cells, and configured to program the second program data into the second group of memory cells, and configured to verify the first group of the memory cells with applying a first verify voltage and a third verify voltage different from the first verify voltage to the first word line, and configured to verify the second group of the memory cells with applying a second verify voltage to the second word line, and configured to read stored data from the first and second group of memory cells; and
    a control circuit configured to control the page buffer and the read-write circuit to program the first group of memory cells with loaded the first program data in the page buffer, and, to program the second group of memory cells with loaded the second program data in the page buffer, and to re-program the first group of memory cells with re-loaded the first program data in the page buffer, wherein the second word line is upper adjacent to the first word line, wherein each of the memory cells of the NAND string structure includes a charge storage layer and during the programming the second group of memory cells, a threshold voltage of at least one of the first group of memory cells is decreased.

11. The non-volatile memory device of claim 10, wherein the non-volatile memory device includes vertical NAND flash memory device.

12. The non-volatile memory device of claim 10, wherein substantially no additional time delay exists between the programming the first group of memory cells and the re-programming the first group of memory cells.

13. The non-volatile memory device of claim 10, further comprising a determining circuit configured to determine a charge characteristic change of the first group of memory cells, wherein the control circuit configured to control the page buffer and the read-write circuit to re-program only memory cell of the first group of memory cells determined to have a charge characteristic change according to the determining circuit.

14. A non-volatile memory system, comprising:
a non-volatile memory device; and
a memory controller configured to control the non-volatile memory device, the memory controller comprises a data buffer configured to store a program data,
the non-volatile memory device comprising:
    a NAND string structure including a plurality of memory cells including a first group of memory cells and a second group of memory cells, formed above a semiconductor substrate in a vertical direction with respect to the semiconductor substrate;
    a read-write circuit configured to program and re-program a first program data into the first group of memory cells, and program a second program data into the second group of memory cells, and read stored data from the first and second group of memory cells,
wherein the memory controller configured to control the data buffer and the non-volatile memory device to program the first group of memory cells with the first program data in the data buffer, and to program the second group of memory cells with the second program data in the data buffer, and to re-program the first group of memory cells with the first program data in the data buffer,
wherein the first group of memory cells and the second group of memory cells are connected to different word lines in the NAND string structure, and substantially no additional time delay exists between the programming the first group of memory cells and the re-programming the first group of memory cells,
wherein each of the memory cells of the NAND string structure includes a charge storage layer.

15. The non-volatile memory system of claim 14, the non-volatile memory device further comprises a page buffer configured to store the first and second program data provided by the data buffer, wherein the memory controller configured to control the page buffer and the read-write circuit to program the first group of memory cells with loaded the first program data in the page buffer, and, to program the second group of memory cells with loaded the second program data in the page buffer and, to re-program the first group of memory cells with re-loaded the first program data in the page buffer.

16. A non-volatile memory system, comprising:
a non-volatile memory device; and
a memory controller configured to control the non-volatile memory device, the memory controller comprises a data buffer configured to store a program data,
the non-volatile memory device comprising:
    a NAND string structure including a plurality of memory cells including a first group of memory cells connected to a first word line and a second group of memory cells connected to a second word line, formed above a semiconductor substrate in a vertical direction with respect to the semiconductor substrate;
    a page buffer configured to store a first and second program data provided from the data buffer;
    a read-write circuit configured to program and re-program the first program data into the first group of memory cells, and configured to program the second program data into the second group of memory cells, and configured to verify the first group of the memory cells with applying a first verify voltage and a third verify voltage different from the first verify voltage to the first word line, and configured to verify the second group of the memory cells with applying a second verify voltage to the second word line, and configured to read stored data from the first and second group of memory cells; and
wherein the memory controller configured to control the data buffer and the non-volatile memory device to program the first group of memory cells with the first program data in the data buffer, and to program the second group of memory cells with the second program data in the data buffer, and to re-program the first group of memory cells with the first program data in the data buffer,
wherein the first group of memory cells and the second group of memory cells are connected to different word lines in the NAND string structure,
wherein each of the memory cells of the NAND string structure includes a charge storage layer, and substantially no additional time delay exists between the programming the first group of memory cells and the re-programming the first group of memory cells, and during the programming the second group of memory cells, a threshold voltage of at least one of the first group of memory cells is decreased.

* * * * *